(12) United States Patent
Kosub et al.

(10) Patent No.: US 9,202,753 B2
(45) Date of Patent: Dec. 1, 2015

(54) SEMICONDUCTOR DEVICES AND METHODS OF PRODUCING THESE

(71) Applicant: Infineon Technologies AG, Neubiberg (DE)

(72) Inventors: Johann Kosub, Neutraubling (DE); Michael Ledutke, Saal (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/754,382

(22) Filed: Jan. 30, 2013

(65) Prior Publication Data
US 2014/0210054 A1    Jul. 31, 2014

(51) Int. Cl.
| | |
|---|---|
| *H01L 29/06* | (2006.01) |
| *H01L 21/78* | (2006.01) |
| *H01L 21/02* | (2006.01) |
| *H01L 23/32* | (2006.01) |
| *H01L 23/498* | (2006.01) |
| *H01L 23/00* | (2006.01) |
| *H01L 21/683* | (2006.01) |
| *H01L 23/538* | (2006.01) |
| *H01L 23/31* | (2006.01) |
| *H01L 21/56* | (2006.01) |

(52) U.S. Cl.
CPC .......... *H01L 21/78* (2013.01); *H01L 21/02697* (2013.01); *H01L 21/6835* (2013.01); *H01L 23/32* (2013.01); *H01L 23/49838* (2013.01); *H01L 23/5389* (2013.01); *H01L 23/562* (2013.01); *H01L 24/24* (2013.01); *H01L 24/82* (2013.01); *H01L 24/96* (2013.01); *H01L 21/561* (2013.01); *H01L 21/6836* (2013.01); *H01L 23/3121* (2013.01); *H01L 2221/68318* (2013.01); *H01L 2221/68327* (2013.01); *H01L 2221/68363* (2013.01); *H01L 2221/68381* (2013.01); *H01L 2224/04105* (2013.01); *H01L 2224/06181* (2013.01); *H01L 2224/24137* (2013.01); *H01L 2224/291* (2013.01); *H01L 2224/2919* (2013.01); *H01L 2224/32145* (2013.01); *H01L 2224/32225* (2013.01); *H01L 2224/32245* (2013.01); *H01L 2224/73267* (2013.01); *H01L 2224/83005* (2013.01); *H01L 2224/92244* (2013.01); *H01L 2224/94* (2013.01); *H01L 2924/1305* (2013.01); *H01L 2924/1306* (2013.01); *H01L 2924/13055* (2013.01); *H01L 2924/13062* (2013.01); *H01L 2924/13091* (2013.01); *H01L 2924/15787* (2013.01); *H01L 2924/3511* (2013.01)

(58) Field of Classification Search
CPC ............... H01L 21/76254; H01L 2924/01079; H01L 21/2007; H01L 21/76251; H01L 21/78
USPC .................... 257/618; 438/455–459, 113, 464
See application file for complete search history.

(56) References Cited

U.S. PATENT DOCUMENTS

| | | | | |
|---|---|---|---|---|
| 6,004,867 | A  * | 12/1999 | Kim et al. | 438/459 |
| 7,358,152 | B2 * | 4/2008 | Kub et al. | 438/459 |
| 2006/0012048 | A1* | 1/2006 | Murai et al. | 257/758 |
| 2007/0141330 | A1* | 6/2007 | Morishima et al. | 428/343 |
| 2011/0134948 | A1* | 6/2011 | Kawakami et al. | 372/34 |
| 2012/0013013 | A1* | 1/2012 | Sadaka et al. | 257/773 |
| 2012/0018194 | A1* | 1/2012 | Maeda et al. | 174/251 |
| 2012/0068336 | A1* | 3/2012 | Lieu et al. | 257/737 |

* cited by examiner

*Primary Examiner* — Cuong Q Nguyen
*Assistant Examiner* — Nishath Yasmeen
(74) *Attorney, Agent, or Firm* — Slater & Matsil, L.L.P.

(57) ABSTRACT

A method includes applying a reinforcing wafer to a semiconductor wafer, thereby forming a composite wafer. Further the method includes dividing the composite wafer, thereby generating a plurality of composite chips each including a semiconductor chip and a reinforcing chip.

21 Claims, 9 Drawing Sheets

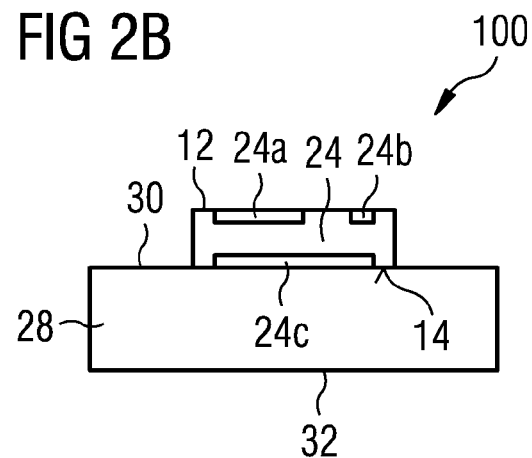
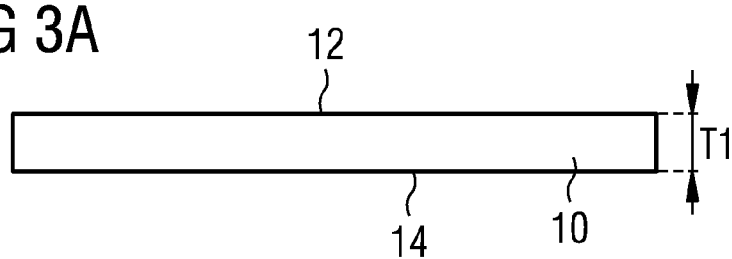
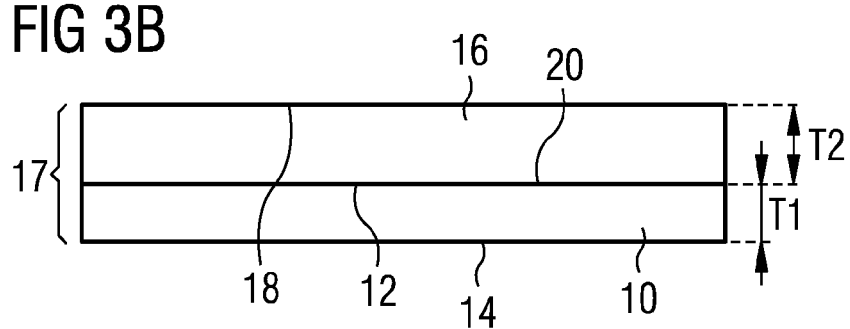
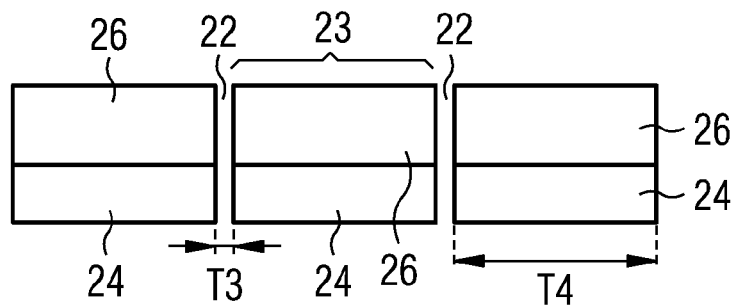

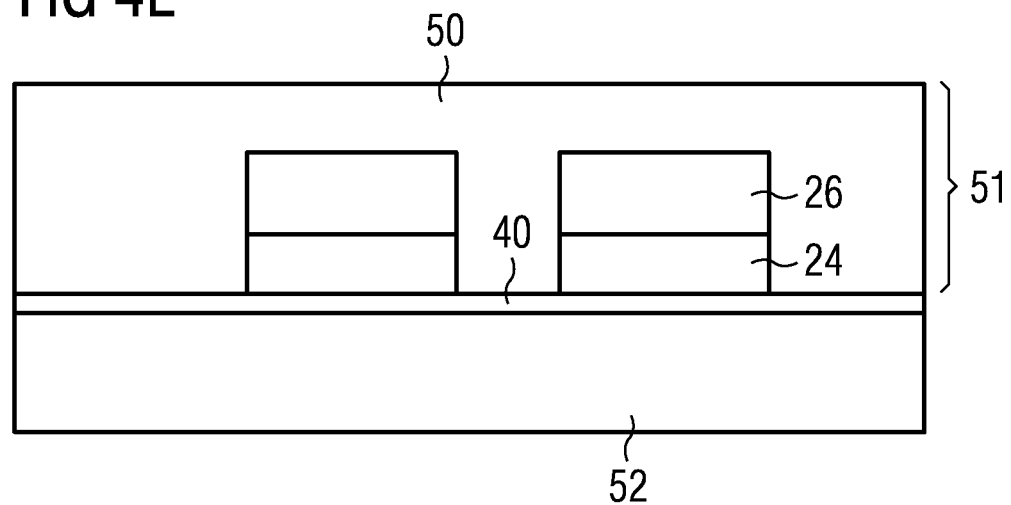
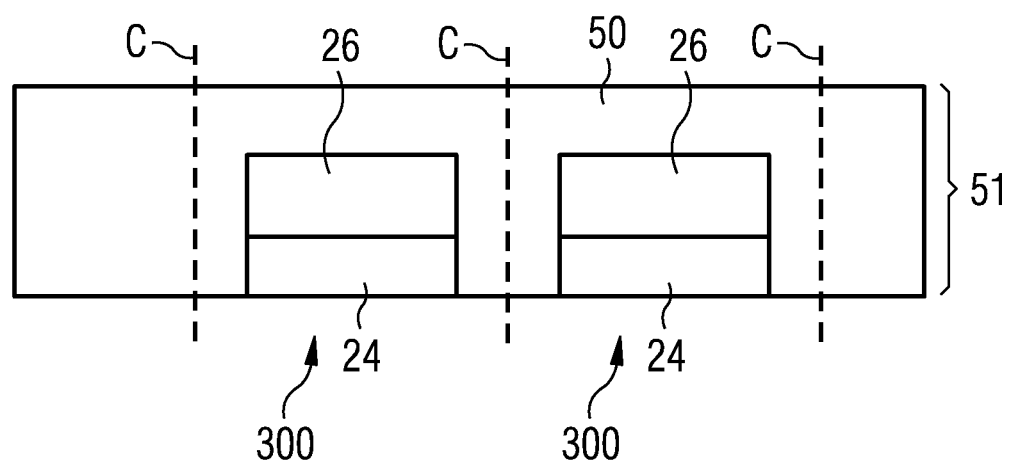

SEMICONDUCTOR DEVICES AND METHODS OF PRODUCING THESE

TECHNICAL FIELD

The invention relates to semiconductor devices and methods of manufacturing these, and more particularly to the technology of handling thin semiconductor wafers or thin semiconductor chips.

BACKGROUND

Semiconductor device manufacturers are constantly striving to increase the performance of their products, while decreasing their cost of manufacture. A cost intensive area in the manufacture of semiconductor devices is packaging the semiconductor chips. As those skilled in the art are aware, integrated circuits are fabricated on wafers, which are then singulated to produce semiconductor chips. As the semiconductor chips are getting thinner and thinner, there is a growing need to be able to handle thin semiconductor wafers or thin semiconductor chips. Subsequently, these thin semiconductor chips may be mounted on electrically conductive carriers, such as lead frames. These thin semiconductor chips may also be used in an artificial wafer. Packaging methods providing high yield at low expenses are desirable.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

FIGS. 2A-2B schematically illustrate cross-sectional views of one embodiment of a method of manufacturing a semiconductor device;

FIGS. 3A-3J schematically illustrate cross-sectional views of one embodiment of a method of manufacturing a semiconductor device;

FIGS. 4A-4F schematically illustrate cross-sectional views of one embodiment of a method of manufacturing a semiconductor device;

DETAILED DESCRIPTION OF ILLUSTRATIVE EMBODIMENTS

Figure 1A:
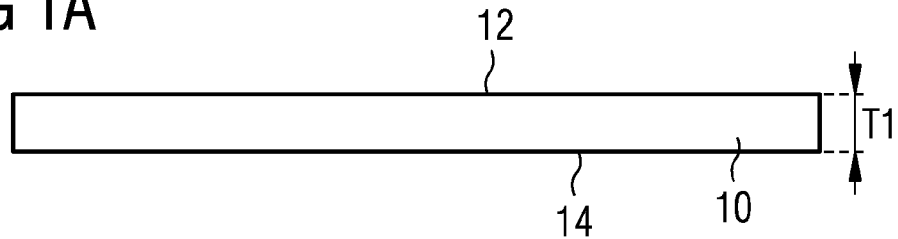
FIGS. 1A-1C schematically illustrate cross-sectional views of one embodiment of a method of manufacturing a semiconductor device.

Aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. The following description is therefore not to be taken in a limiting sense, and the scope is defined by the appended claims. It should also be noted that the representations of the various chips, layers, carriers or substrates in the Figures are not necessarily to scale.

In the following detailed description, reference is made to the accompanying drawings, which form a part thereof, and in which is shown by way of illustration specific embodiments in which the invention may be practiced. In this regard, directional terminology, such as "top," "bottom," "left," "right," "upper," "lower" etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise or unless technically restricted.

As employed in this specification, the terms "bonded," "attached," or "connected" are not meant to mean that the elements must be directly be contacted together; intervening elements or layers may be provided between the "bonded," "attached," or "connected" elements.

The semiconductor chips described further below may be of different types, may be manufactured by different technologies and may include for example integrated electrical, electro-optical or electro-mechanical circuits and/or passives.

The semiconductor chips may comprise integrated circuits such as, e.g., logic integrated circuits, control circuits, microprocessors, memory devices, etc.

In particular, semiconductor chips having a vertical structure may be involved, that is to say that the semiconductor chips may be fabricated in such a way that electric currents can flow in a direction perpendicular to the main faces of the semiconductor chips. A semiconductor chip having a vertical structure has electrodes on its two main faces, that is to say on its top side and bottom side (the bottom side is also referred to as backside herein).

The semiconductor chip(s) may, for example, be power semiconductor chip(s). Power semiconductor chips may have a vertical structure. The vertical power semiconductor chip(s) may, for example, be configured as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. By way of example, the source electrode and gate electrode of a power MOSFET may be situated on front side main face, while the drain electrode of the power MOSFET is arranged on the backside main face.

The semiconductor chips need not be manufactured from specific semiconductor material, for example Si, SiC, SiGe, GaAs, and, furthermore, may contain inorganic and/or organic materials that are not semiconductors, such as for example insulators, plastics or metals.

The semiconductor chip(s) considered herein may be thin. In order to allow handling or manipulation of the semiconductor chips, e.g., handling/manipulation required for packaging, eWLP (embedded Wafer Level Packaging), or semiconductor device assembly, the semiconductor chip may form part of a composite chip. A composite chip may comprise the semiconductor chip and a reinforcing chip secured to the semiconductor chip. The reinforcing chip adds stability and/or strength to the composite chip to make it manageable.

The devices described below may include one or more semiconductor chips. By way of example, one or more semiconductor power chips may be included. Further, one or more logic integrated circuits may be included in the devices. The logic integrated circuits may be configured to control the integrated circuits of other semiconductor chips, for example the integrated circuits of power semiconductor chips. The logic integrated circuits may be implemented in logic chips.

The semiconductor chips may have contact pads (or electrodes) which allow electrical contact to be made with the integrated circuits included in the semiconductor chips. The electrodes may be arranged all at only one main face of the semiconductor chip or at both main faces of the semiconductor chip. They may include one or more electrode metal layers which are applied to the semiconductor material of the semiconductor chips. The electrode metal layers may be manufactured with any desired geometric shape and any desired material composition. For example, they may comprise or be made of a material selected of the group of Cu, Ni, NiSn, Au, Ag, Pt, Pd, and an alloy of one or more of these metals.

The semiconductor chip(s) may be bonded to a carrier. The carrier may be a (permanent) device carrier used for packaging. The carrier may, e.g., be selected from the group of a leadframe, a ceramics substrate such as, e.g., a DCB (direct copper bonded) ceramics substrate, and a printed circuit board (PCB).

Bonding the semiconductor chip(s) to the carrier may, e.g., be done by soldering, gluing, or sintering. In case the semiconductor chip is attached by soldering, a soft solder material or, in particular, a solder material capable of forming diffusion solder bonds may be used, for example a solder material comprising one or more metal materials selected from the group of Sn, SnAg, SnAu, SnCu, In, InAg, InCu and InAu.

The semiconductor chip may be embedded in an encapsulant. The encapsulant is sometimes referred to in the art as an "artificial wafer" or a "molded reconfigured wafer." In this case, semiconductor devices are produced by separating the encapsulant into multiple packages. Embedding semiconductor chips in an encapsulant is referred to as eWLP.

The encapsulant used in eWLP may be utilized to produce fan-out type packages. In a fan-out type package at least some of the external contact pads and/or conductor lines connecting the semiconductor chip to the external contact pads are located laterally outside of the outline of the semiconductor chip or do at least intersect the outline of the semiconductor chip. Thus, in fan-out type packages, a peripherally outer part of the package of the semiconductor chip is typically (additionally) used for electrically bonding the package to external applications, such as application boards etc. This outer part of the package encompassing the semiconductor chip effectively enlarges the contact area of the package in relation to the footprint of the semiconductor chip, thus leading to relaxed constraints in view of package pad size and pitch with regard to later processing, e.g., second level assembly.

The semiconductor chip(s) may be covered with an encapsulation material in order to be embedded in an encapsulant (artificial wafer) for eWLP processing or after being bonded to a device carrier (substrate). The encapsulation material may be electrically insulating. The encapsulation material may comprise or be made of any appropriate plastic or polymer material such as, e.g., a duroplastic, thermoplastic or thermosetting material or laminate (prepreg), and may, e.g., contain filler materials. Various techniques may be employed to encapsulate the semiconductor chip(s) with the encapsulation material, for example compression molding, injection molding, powder molding, liquid molding or lamination. Heat and/or pressure may be used to apply the encapsulation material.

Figure 1B:
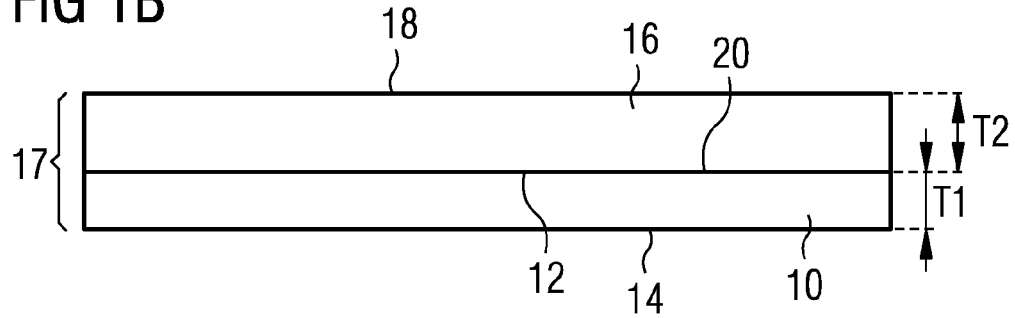
Figure 1C:
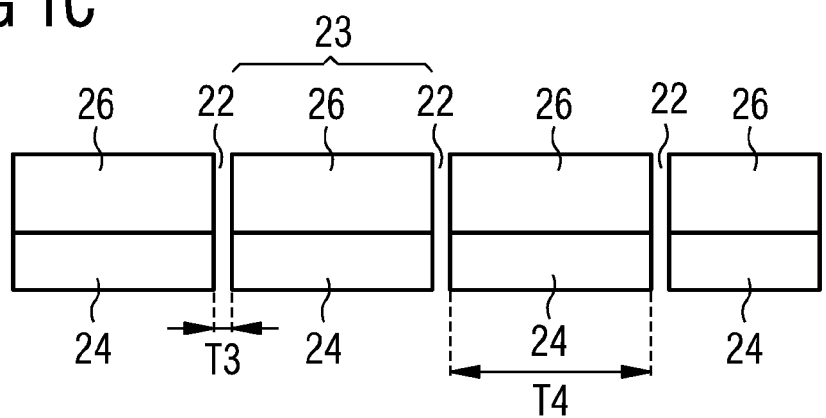

FIGS. 1A-1C illustrate a method of manufacturing a plurality of composite chips 23, each comprising a semiconductor chip 24 and a reinforcing chip 26, in accordance with one embodiment. FIG. 1A illustrates providing a semiconductor wafer 10 having a first main face 12 and a second main face 14. The first main face 12 of the semiconductor wafer 10 may, e.g., be the backside or the front side of the semiconductor wafer 10. The same applies vice-versa for the second main face 14 of the semiconductor wafer 10.

The semiconductor wafer 10 may, e.g., have a thickness T1 which is smaller than 40 µm, 30 µm, 20 µm, or 10 µm. The semiconductor wafer 10 may, e.g., be disc-shaped having a rounded outline and a lateral dimension, e.g., diameter, of the semiconductor wafer 10 may, e.g., be equal to or greater than 200 or 300 mm.

The semiconductor wafer 10 as shown in FIG. 1A may have been thinned in a previous step (not shown in FIGS. 1A-1C) to have the thickness T1. The thinned surface may, e.g., be the first main face 12 of the semiconductor wafer 10. In this case the second main face 14 of the semiconductor wafer 10 may have been processed during front-end wafer processing to produce active structures such as, e.g., integrated circuits, pn transitions, micro-mechanical structures, etc. Processing the second main face 14 may be carried out before or after thinning the first main face 12 of the semiconductor wafer 10. In this case the second main face 14 of the semiconductor wafer 10 may be the front side of the semiconductor wafer 10. As will be explained further below in greater detail, in this case, e.g., an eWLP process may be used to produce semiconductor devices.

It is also possible that the thinned surface may, e.g., be the second main face 14 of the semiconductor wafer 10. In this case the first main face 12 of the semiconductor wafer 10 may have been processed, e.g., before or after thinning the second main face 14. In this case the first main face 12 of the semiconductor wafer 10 may be the front side of the semiconductor wafer 10.

Thinning the semiconductor wafer 10 may comprise at least one process selected from the group of mechanical thinning, in particular grinding, lapping, chemical mechanical polishing (CMP), and wet etching. Whilst grinding tools use an abrasive wheel, lapping tools use a fluid ("slurry") charged with "rolling" abrasive particles acting between two surfaces. Thinning the semiconductor wafer 10 may also comprise a plurality or all of the aforementioned processes.

Referring to FIG. 1B, a reinforcing wafer 16 is applied on the semiconductor wafer 10. The reinforcing wafer 16 may be a prefabricated part which is attached or adhered to the semiconductor wafer 10 by, e.g., gluing or other joining techniques. Or, in other embodiments, the reinforcing wafer 16 may be a layer which is formed, grown and/or deposited on the semiconductor wafer 10 by a suitable layer formation, growing and/or material deposition processes.

The reinforcing wafer 16 may have a first main face 18 and a second main face 20. The second main face 20 of the reinforcing wafer 16 may be applied on top of the first main face 12 of the semiconductor wafer 10.

The reinforcing wafer 16 may have lateral dimensions corresponding to the lateral dimensions of the semiconductor wafer 10. More specifically, the reinforcing wafer 16 may fully cover the entire surface area (e.g., of the first main face 12) or at least most of the surface area of the semiconductor wafer 10, e.g., more than, e.g., 70%, 80%, 90% of the surface area of the semiconductor wafer 10. The reinforcing wafer 16 may, e.g., have a thickness T2 which may be greater than the thickness T1 of the semiconductor wafer 10. By way of example, the thickness T2 may, e.g., be greater than 40 µm, 30 µm, 20 µm, or 10 µm. In other embodiments, the reinforcing wafer 16 may, e.g., have a thickness T2 which is less than the thickness T1 of the semiconductor wafer 10. By way of example, the thickness T2 may, e.g., be less than 40 µm, 30 µm, 20 µm, or 10 µm. The thickness T2 may be essentially constant across the lateral extension of the reinforcing wafer 16.

The reinforcing wafer 16 may, e.g., comprise or be made of a material selected from the group of glass, a resin material, copper, a copper alloy, a mold material, in particular a mold material for eWLP, or amorphous silicon.

By applying the reinforcing wafer 16 to the semiconductor wafer 10, a composite wafer 17 is formed. The composite wafer 17 may have a thickness which is equal or greater than the sum of the thickness T1 of the semiconductor wafer 10 and the thickness T2 of the reinforcing wafer 16. As the composite wafer 17 adds stability and/or rigidity and/or strength to the composite wafer 17, the composite wafer 17 may be handled or manipulated in subsequent method steps with reduced risk that the semiconductor wafer 10 breaks or cracks because it is reinforced by the reinforcing wafer 16. On the other hand, if these subsequent method steps were applied to the semiconductor wafer 10 alone, there would be a risk that the semiconductor wafer 10 might break or crack because of the small thickness of the semiconductor wafer 10 considered herein.

For example, the prefabricated reinforcing wafer 16 may be applied to the semiconductor wafer 10 by, e.g., adhesion or gluing, in particular by using a releasable adhesive or glue or by using a non-releasable adhesive or glue. If a releasable adhesive or glue is used, e.g., an adhesive or glue which exhibits thermo release properties, after dicing the composite wafer 17 into composite chips, the chips of the reinforcing wafer 16 and the chips of the semiconductor wafer 10 may, e.g., be disconnected from each other in a subsequent step, e.g., by using a thermo process. On the other hand, the chips of the reinforcing wafer 16 and the chips of the semiconductor wafer 10 may, e.g., remain connected to each other during all further fabrication steps. By way of example, if e.g., a non-releasable adhesive or glue is used, the chips of the reinforcing wafer 16 and the chips of the semiconductor wafer 10 may be non-detachable from each other.

The reinforcing wafer 16 may, e.g., be applied to the front side of the semiconductor wafer 10, see, e.g., the examples of FIGS. 1-3. The reinforcing wafer 16 may, e.g., be applied to the backside of the semiconductor wafer 10, see, e.g., the examples of FIGS. 1, 4 and 5.

The semiconductor wafer 10 may, e.g., be thinned before or after the reinforcing wafer 16 is applied to the semiconductor wafer 10. In the latter case, the second main face 14 of the semiconductor wafer 10 which is not facing the reinforcing wafer 16 is thinned. Further, the reinforcing wafer 16 may, e.g., be used as a carrier for the thinning process or for other manufacturing steps used for generating the semiconductor wafer 10.

FIG. 1C illustrates dividing, in particular dicing the composite wafer 17. Dividing the composite wafer 17 generates a plurality of composite chips 23 each comprising a semiconductor chip 24 and a reinforcing chip 26 and, e.g., a layer of adhesive (not shown) arranged between the semiconductor chip 24 and a reinforcing chip 26. Dividing the composite wafer 17 may be performed by any suitable technique, e.g., by blade dividing (sawing), laser dicing, etching, cutting etc. In particular, stealth dicing, which is a specific technique using laser dicing may, e.g., be applied. The composite wafer 17 may, e.g., be divided along a section line which extends between the first main face 18 of the reinforcing wafer 16 and the second main face 14 of the semiconductor wafer 10. The section line may, e.g., be perpendicular to the first main face 18 of the reinforcing wafer 16 and the second main face 14 of the semiconductor wafer 10.

The reinforcing wafer 16 may, e.g., be transparent, which may be advantageous for aligning the composite wafer 10 during dividing and/or subsequent chip placing or mounting processes. Further, alignment markings (not shown) may be applied on the reinforcing wafer 16 in order to assist dividing the composite wafer 17 and/or subsequent chip placing or mounting processes. That is, the alignment markings may, e.g., be used for cutting, dicing, etching, etc., the composite wafer 17 into composite chips 23, and/or, e.g., for composite chip 23 placement or mounting.

The composite wafer 17 may be diced along dicing kerfs 22 which may run perpendicular to the first main face 18 of the reinforcing wafer 16 and the second main face 14 of the semiconductor wafer 10. In FIG. 1C the dicing kerfs 22 are also perpendicular to the second main face 20 of the reinforcing wafer 16 and the first main face 12 of the semiconductor wafer 10. The width of each dicing kerf 22 may be T3 and may depend on the dicing technique and equipment used (e.g., may correspond to the blade width). By way of example T3 may amount to some tens of microns.

By way of example, the composite wafer 17 may be diced by applying the composite wafer 17 on a tape, in particular a dicing tape, apply the dicing pattern, in particular a rectangular pattern, to the composite wafer 17, e.g., according to one or more of the above mentioned techniques, and pull the tape, e.g., along orthogonal directions in the plane of the tape. By pulling the tape, the composite wafer 17 gets divided into a plurality of composite chips 23.

A lateral dimension of the composite chips 23 may correspond to the distance between adjacent dicing kerfs 22 and is denoted by T4. T4 may correspond to the usual length or width dimension of a semiconductor chip and may, e.g., be less than 10 mm, 5 mm or 1 mm. The lateral dimensions of adjacent composite chips 23 may, e.g., be the same or different.

The reinforcing chip 26 adds stability and/or rigidity and/or strength to the semiconductor chip 24. That way, the composite chip 23—and thus the semiconductor chip 24—may be handled or manipulated in subsequent steps with significantly reduced risk that the semiconductor chip 24 breaks or cracks. On the other hand, if any subsequent handling or manipulation were applied to the semiconductor chip 24 alone, there would be a significant or, e.g., high risk that the semiconductor chip 24 would break or crack because of the small thickness T1 of the semiconductor chip 24.

Figure 2A:
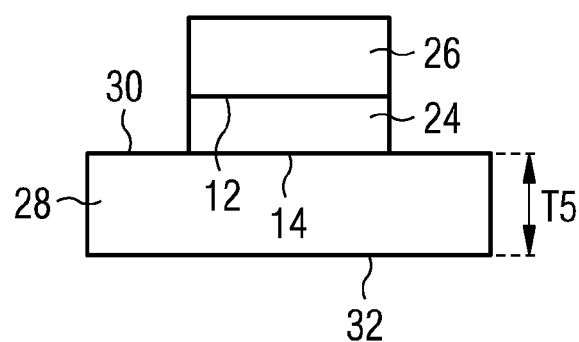

FIGS. 2A-2C illustrate a method of manufacturing a semiconductor device 100 in accordance with one embodiment. This method is one example of a variety of possibilities of continuing the method illustrated in FIGS. 1A-1C. This means that the method step illustrated in FIG. 2A may be performed after the step shown in FIG. 1C. However, it is also possible that the composite chips 23 are processed differently, or that the composite chips 23 are not further processed or packaged and are, e.g., shipped as "bare dies" to a customer.

FIG. 2A illustrates attaching, in particular bonding of a composite chip 23 to a substrate 28. The substrate 28 may have a first main face 30 and a second main face 32. The substrate 28 may have a thickness T5. The thickness T5 is the distance between the first main face 30 and the second main face 32. T5 may depend on the type of substrate and on the application (e.g., low power or high power application). T5 may, e.g., be greater than 100 microns or 1 mm. T5 may, e.g., be less than 5 mm or 3 mm. The substrate 28 may, e.g., be a leadframe, a ceramics substrate such as, e.g., a DCB (direct copper bonded) ceramics substrate, a printed circuit board (PCB), etc. The substrate 28 may, e.g., form a (permanent) device carrier of a semiconductor package.

In FIG. 2A the composite chip 23 is bonded to the substrate 28 with the semiconductor chip 24 of the composite chip 23 facing the substrate 28. This means that the second main face 14 of the semiconductor chip 24 is bonded to the first main face 30 of the substrate 28. Bonding may, e.g., be done by gluing or by soldering, in particular diffusion soldering.

FIG. 2B illustrates separating the reinforcing chip 26 of the composite chip 23 from the semiconductor chip 24 of the composite chip 23. After separating the reinforcing chip 26 from the semiconductor chip 24, the resulting semiconductor device 100 comprises the substrate 28 having the semiconductor chip 24 attached on top of the substrate 28. The step of separating the reinforcing chip 26 from the semiconductor chip 24 may be done during or after the bonding of the composite chip 23 to the substrate 28. In the first case this means that the reinforcing chip 26 is separated from the semiconductor chip 24 while the composite chip 23 is being attached or bonded to the substrate 28. In the latter case this means that the reinforcing chip 26 is separated from the semiconductor chip 24 after the composite chip 23 has been attached or bonded to the substrate 28.

More specifically, bonding the composite chip 23 to the substrate 28 and separating the reinforcing chip 26 from the semiconductor chip 24 may, e.g., be performed within a single process, in particular a single thermo process such as, e.g., a thermo gluing process or a soldering process. During this single process, the composite chip 23 and the substrate 28 are mechanically and, optionally, electrically connected together and the reinforcing chip 26 and the semiconductor chip 24 are disconnected.

Further, bonding the composite chip 23 to the substrate 28 may be performed by a first process, e.g., gluing, which may be performed as a non-thermo process, and separating the reinforcing chip 26 from the semiconductor chip 24 may, e.g., be performed by a second process, which might, e.g., be a thermo process. In both cases, the adhesive or glue used to secure the reinforcing wafer 16 to the semiconductor wafer 10 may exhibit thermo release properties.

The semiconductor device 100 may be a semiconductor package containing on or a plurality of semiconductor chips 24. By way of example, the semiconductor chip 24 may be a power semiconductor chip and/or the substrate 28 may be a leadframe comprising a chip pad acting as device carrier and a lead acting as an external package terminal. A source electrode 24a and a gate electrode 24b of the power semiconductor chip, e.g., a power MOSFET, may be situated on the first main face 12, while a drain electrode 24c of the power semiconductor chip 24 may be arranged on the second main face 14. Further, the substrate 28, e.g., a leadframe, and the semiconductor chip 24 may be encapsulated in a package body (not shown) made of an encapsulation material, which may be electrically insulating. The encapsulation material (not shown) may be of any of the materials as mentioned above and may, for example, be applied by compression molding, injection molding, powder molding, liquid molding or lamination.

FIGS. 3A-3H illustrate an exemplary method of manufacturing a semiconductor device 200 in accordance with one embodiment. This method is similar to the methods described in the FIGS. 1A-1C and 2A-2B, and reference is made to the above description in order to avoid reiteration. A difference, however, may be that it uses an attach panel in a batch process for attaching a plurality of composite chips 23 to a substrate 28.

FIG. 3A illustrates a semiconductor wafer 10 having a first main face 12 and a second main face 14. The semiconductor wafer 10 which is depicted in FIG. 3A has the same features as the semiconductor wafer 10 of FIG. 1A. In particular this applies to the dimensions of the semiconductor wafer 10, and, e.g., thinning the semiconductor wafer 10.

FIG. 3B illustrates that a reinforcing wafer 16 is applied to the semiconductor wafer 10, thereby forming a composite wafer 17. The process of applying the reinforcing wafer 16 and composite wafer 17 which is depicted in FIG. 3B may have the same features as described in conjunction with FIG. 1B. In particular this may apply to the dimensions, e.g., to the dimensions of the reinforcing wafer 16 and the semiconductor wafer 10, the method of applying the reinforcing wafer 16 to the semiconductor wafer 10, the orientation of the reinforcing wafer 16 relative to the semiconductor wafer 10, and the material of the reinforcing wafer 16.

FIG. 3C illustrates dicing the composite wafer 17. The method step illustrated in FIG. 3C may have similar features as the method step shown in FIG. 1C, and reference is made to the above description to avoid reiteration.

Figure 3D:
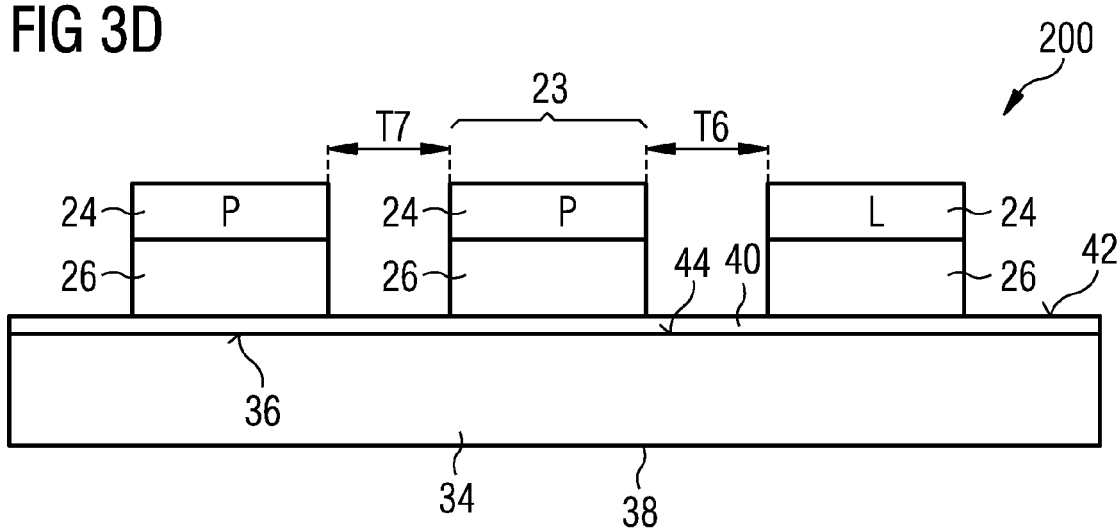

In FIG. 3D the composite chips 23 are releasably fixed to an attach panel 34. The attach panel 34 may, e.g., be used for a batch die attach process. In FIG. 3D an adhesive tape 40 may, e.g., be used to fix the composite chips 23 to the attach panel 34. The attach panel 34 may have a first main face 36 and a second main face 38. The adhesive tape 40 may have a first main face 42 and a second main face 44. In FIG. 3D the first main face 36 of the attach panel 34 is facing the second main face 44 of the adhesive tape 40.

By way of example, the composite chips 23 are attached to the attach panel 34 with the reinforcing chips 26 facing the attach panel 34. The first main face 42 of the adhesive tape 40 may, e.g., be coated with permanent glue. The second main face 44 of the adhesive tape 40 may, e.g., be coated with releasable glue. This means that the connection between the first main face 42 of the adhesive tape 40 and the composite chips 23 may, e.g., not be released easily and that the connection between the second main face 44 of the adhesive tape 40 and the attach panel 34 may, e.g., be released.

The second main face 44 of the adhesive tape 40 may thus be releasably glued on top of the first main face 36 of the attach panel 34. Attaching the composite chips 23 to the attach panel 34 may, e.g., be done by placing the composite chips 23 on the first main face 42 of the adhesive tape 40 with the reinforcing chip 26 facing the adhesive tape 40. The composite chips 23 may be placed on the attach panel 34 having relative distances of T6 and T7, respectively. The positions of the composite chips 23 on the attach panel 34 may be chosen to correspond to the desired positions of the semiconductor chips 24 in the semiconductor device 200. Thus, T6 and T7 may, e.g., be different or may, e.g., be identical in accordance with device design parameters.

Figure 3E:
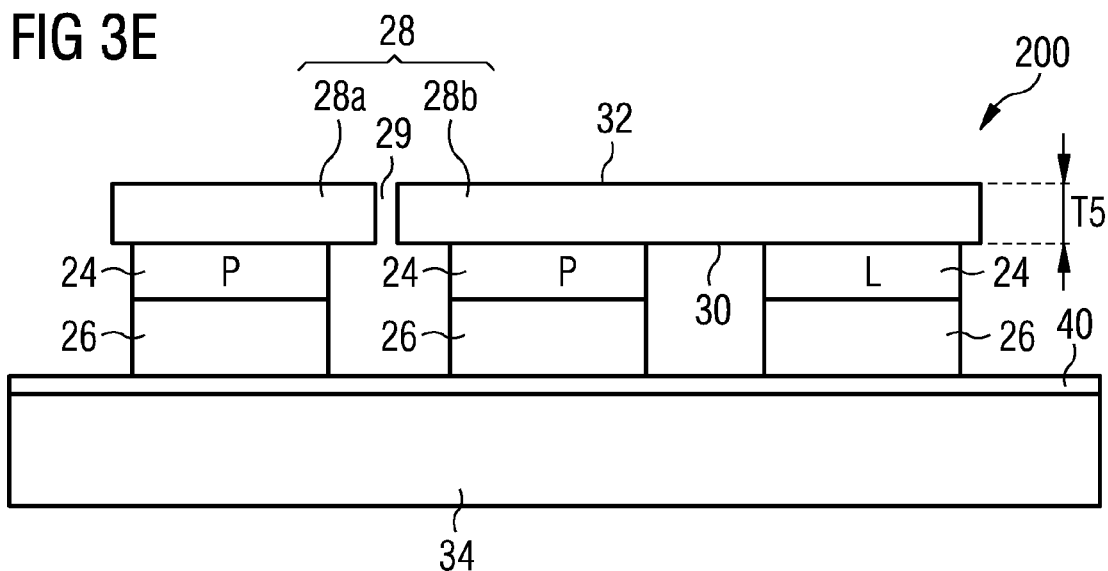

FIG. 3E illustrates attaching, in particular bonding, the composite chips 23 to a substrate 28. This may, e.g., be done in a batch process which means that the plurality of composite chips 23 are attached, in particular bonded, to the substrate 28 simultaneously. The thickness of the substrate 28 may, e.g., correspond to T5. As in FIG. 2A, the composite chips 23 may be bonded to the first main face 30 of the substrate 28.

The substrate 28 of FIG. 3E may, e.g., be of one of the types mentioned before. The substrate 28 may include a plurality of parts 28a, 28b. The parts 28a, 28b may, e.g., be insular, i.e., not interconnected with each other. By way of example, the parts 28a, 28b may represent chip pads of a leadframe 28 separated by a gap 29.

The process of attaching, in particular bonding, the composite chips 23 to the substrate 28 may, e.g., be done by gluing or soldering, in particular diffusion soldering. Reference is made to the description above to avoid reiteration. The process shown in FIG. 3E may, e.g., be done in a single die attach process step.

Figure 3F:
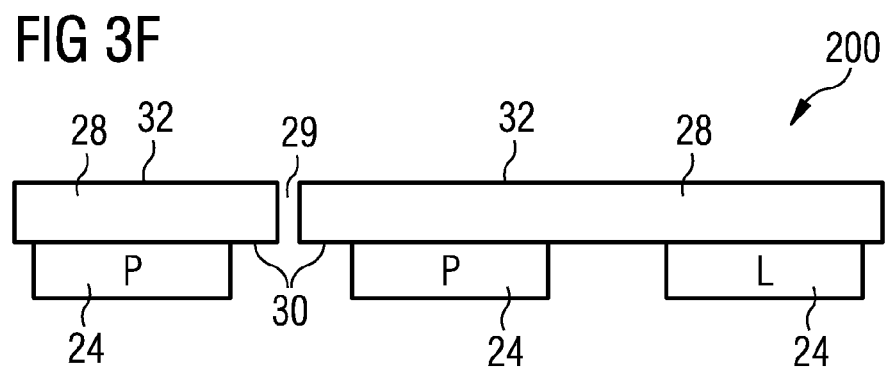

FIG. 3F illustrates separating the reinforcing chips 26 of the composite chips 23 from the semiconductor chips 24 of the composite chips 23. This may, e.g., be done during or after attaching, in particular bonding, the composite chips 23 to the substrate 28. In the first case attaching the composite chips 23 to the substrate 28 as shown in FIG. 3E and removing the reinforcing chips 26 from the composite chips 23 as shown in FIG. 3F may be done within a single thermo process as, e.g., described above. That is, the application of heat may cause that on the one hand the connection between the reinforcing chips 26 and the semiconductor chips 24 is disconnected and on the other hand that a connection between the semiconductor chips 24 of the composite chips 23 and the substrate 28 is established simultaneously. In the second case, removing the reinforcing chips 26 from the composite chips 23 may be done in a separate process step after attaching, in particular bonding, of the composite chips 23 to the substrate 28. In both cases, the semiconductor chips 24 are protected by the reinforcing chips 26 during the die attach process.

After the release of the reinforcing chips 26 from the composite chips 23, the adhesive tape 40 and the reinforcing chips 26 fixed to the adhesive tape 40 may be released from the attach panel 34. The attach panel 34 may then be reused for further processes as exemplified by FIGS. 3A to 3F.

By way of example, the method steps of FIGS. 3A-3E may be performed for two different types of semiconductor chips, e.g., power chips and logic chips. Then the power chips and logic chips may be placed next to each other like in the illustration of FIG. 3D. It is also possible to place a plurality of power chips and a logic chip controlling the plurality of power chips next to each other. By way of example, without loss of generality, semiconductor chip(s) 24 labeled by "P" may be power chip(s) and semiconductor chip(s) 24 labeled by "L" may be logic chip(s).

While the power chips P may be attached to the substrate 28 using, e.g., soldering, the logic chip L may be attached to the substrate 28 by, e.g., gluing in a single step. While the power chips P may already have a layer of solder applied to their backsides, the glue necessary for gluing the logic chips L may be applied in advance on the substrate 28 at the respective positions. As will be described in more detail below, an arrangement as shown in FIG. 3F may be used for an DC-DC converter device 200.

Figure 3G:
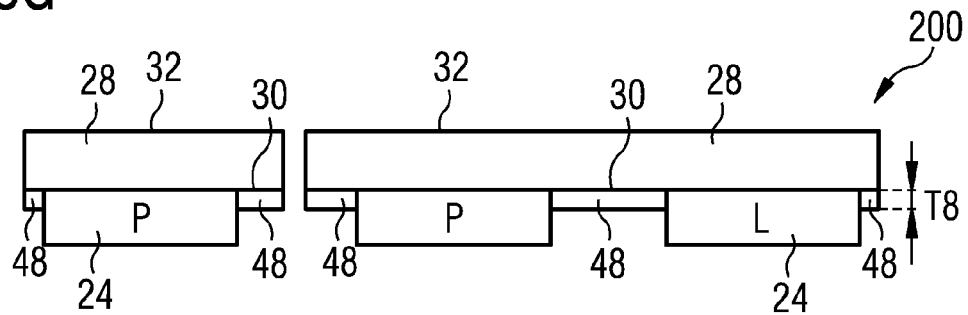

FIG. 3G illustrates, as an optional measure, depositing, in particular galvanically depositing, a metal, e.g., copper, onto the substrate 28, e.g., a leadframe, to embed the semiconductor chips 24 in the deposited metal. By galvanically depositing metal onto the substrate 28, in particular on the first main face 30 thereof as depicted in FIG. 3G, a metal layer 48 grows on the substrate 28. The thickness of the deposited metal layer 48 is referred to as T8. As no metal grows on the semiconductor chips 24, the distance between the second main face 14 of the semiconductor chips 24 and the outer surface of the deposited metal layer 48 will decrease.

Figure 3H:
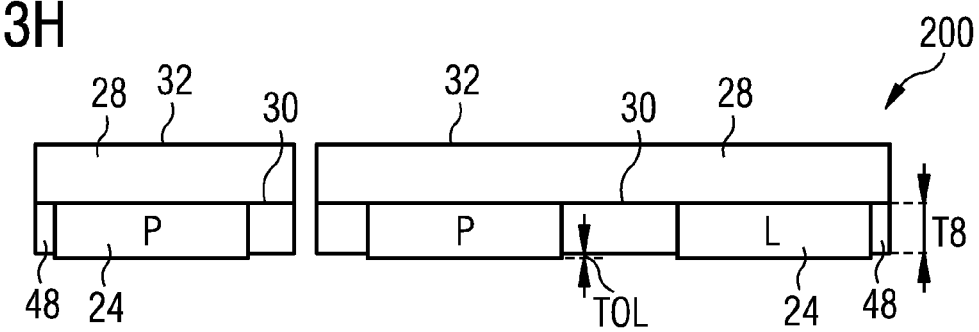

As illustrated in FIG. 3H, this process of growing, e.g., galvanically depositing the metal layer 48 onto the substrate 28 may, e.g., be continued until a main surface of the semiconductor chips 24 facing away from the substrate 28 and the outer surface of the deposited metal 48 are at the same level with each other, e.g., within a tolerance TOL of less than 5 µm, 2 µm, 1 µm, or 0.5 µm. Further, the main surface of the semiconductor chips 24 facing away from the substrate 28 and the outer surface of the deposited metal 48 may, e.g., be flush, i.e., without gap in between.

If one considers the substrate 28 plus the galvanically deposited metal layer 48 to be a new substrate, then one can say that the process step of FIG. 3G may reduce the topographic differences between the main surface of the semiconductor chips 24 facing away from the new substrate and the outer surface of the new substrate to form a common plane or platform for further processing. Further processing may include thin film processing, e.g., thin film metal layer generation or thin film polymer layer generation, structuring, vias generation, lamination, molding, or other process steps used in the technology of packaging.

Figure 3I:
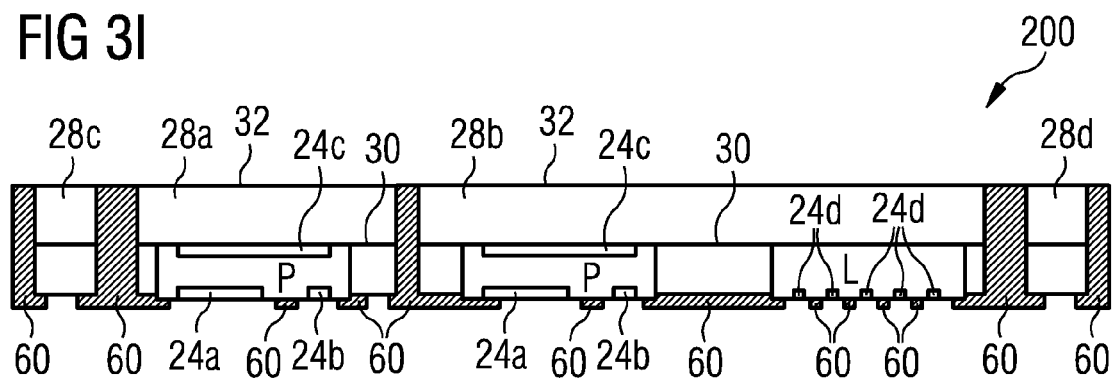
Figure 3J:
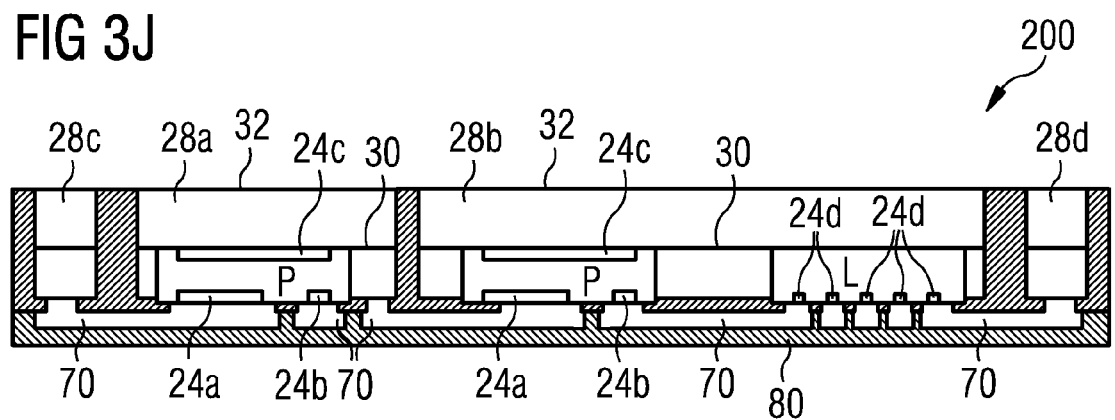

By way of example, according to FIG. 3I, the substrate 28 may further comprise parts 28c and 28d (not depicted in the previous Figures). Parts 28c and 28d may be insular and may, e.g., be terminal parts of the substrate 28, e.g., a leadframe.

By way of example, the gaps between the parts 28a, 28b, 28c, 28d may be filled with an insulating material. Further, a structured insulating layer 60, e.g., a polymer layer, may be applied to the common plane of small topographic differences, which, by virtue of the metal deposition step of FIG. 3H, may be used as a building platform for subsequent processing steps.

By way of example, subsequent processing may comprise generating an electrical interconnect. Generating an electrical interconnect is exemplified in FIG. 3J by applying an electrically conducting layer 70, which is structured in accordance with the desired signal and current routing.

By way of example, part 28c may be connected to the source of the first power chip depicted at the left hand side, part 28a may be connected to the drain of the first power chip and to the source of the second power chip. Part 28b may be connected to the drain of the second power chip. The logic chip L positioned to the right may have electrodes 24d which are connected to the gate electrodes of the power chips and to part 28d. As is apparent for a person skilled in the art, the device 200 as shown in FIG. 3I may represent a DC-DC converter.

Further, subsequent processing may comprise applying an encapsulation material 80 to protect the device 200 against environmental impact and, e.g., to create an insulating envelope. By way of example, lamination or molding techniques may be used.

FIGS. 4A-4G illustrate a method of manufacturing a semiconductor device 300 in accordance with one embodiment.

Figure 4A:
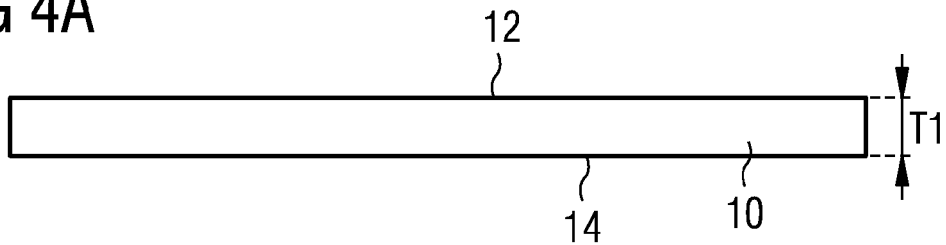

FIG. 4A illustrates a semiconductor wafer 10 having a first main face 12 and a second main face 14. The semiconductor wafer 10 which is depicted in FIG. 4A may have the same features as the semiconductor wafer 10 of FIG. 1A or 3A. Reference is made to the corresponding description to avoid reiteration.

Figure 4B:
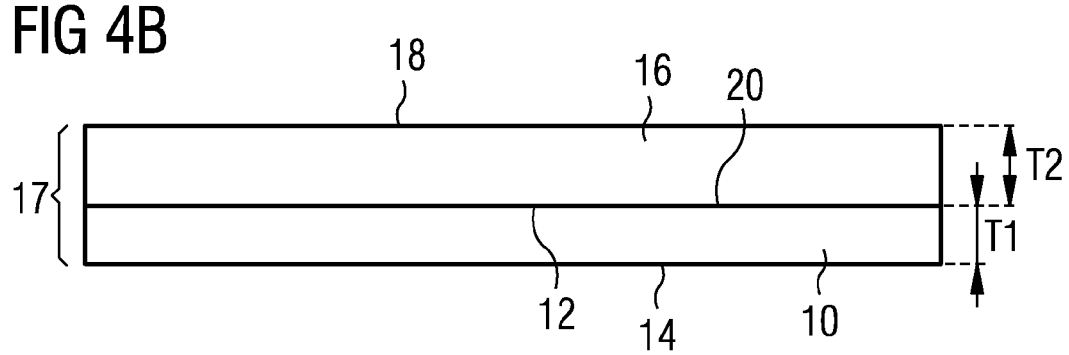

FIG. 4B illustrates applying a reinforcing wafer 16 on the semiconductor wafer 10, thereby forming a composite wafer 17. The composite wafer 17 as depicted in FIG. 4B has the same features as the composite wafer 17 depicted in FIGS. 1B and 3B. Reference is made to the corresponding description to avoid reiteration.

Figure 4C:
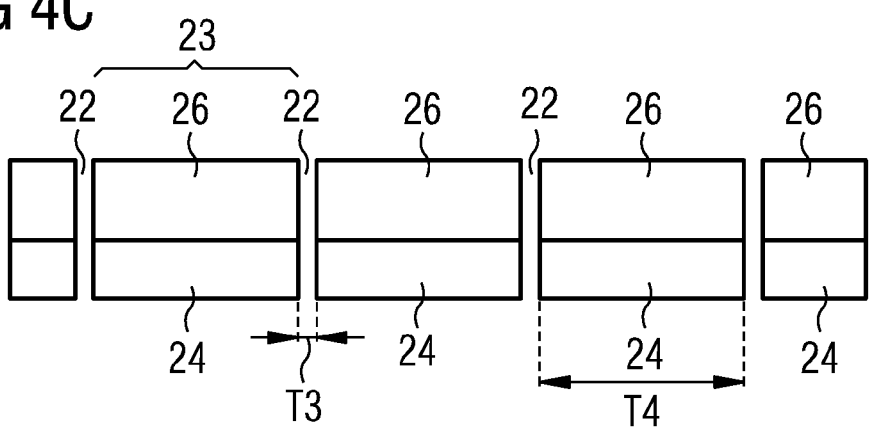

FIG. 4C illustrates dividing the composite wafer 17. The method step illustrated in FIG. 4C has the same or similar features as the method step shown in FIG. 1C or 3C. Reference is made to the corresponding description to avoid reiteration.

Figure 4D:
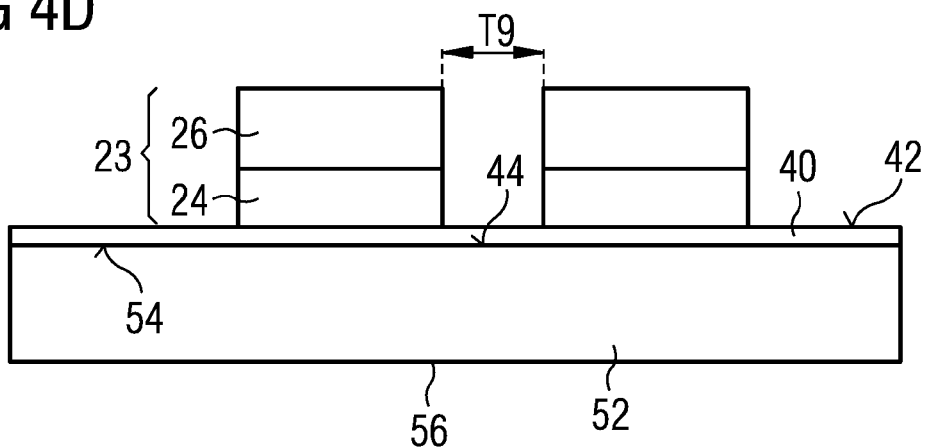

FIG. 4D illustrates releasably attaching the diced composite chips 23 to a temporary carrier 52 using, e.g., an adhesive tape 40. The adhesive tape 40 of FIG. 4D may have similar features as the adhesive tape 40 shown in FIG. 3D. However, in contrast to the adhesive tape 40 of FIG. 3D, the adhesive tape 40 of FIG. 4D may be coated on both sides with releasable glue.

The temporary carrier 52 may have a first main face 54 and a second main face 56. The second main face of the adhesive tape 40 may be placed onto the first main face 54 of the temporary carrier 52 for fixing the adhesive tape 40 at the temporary carrier 52.

The diced composite chips 23 may be placed on top of the first main face 42 of the adhesive tape 40, e.g., by using a pick and place process. The composite chips 23 may be placed on the adhesive tape 40 in a spaced-apart relationship, wherein the horizontal distance between adjacent composite chips 23 may, e.g., be T9. FIG. 4D only depicts two composite chips 23 placed on the temporary carrier, however, there may be more than two composite chips 23 attached to the temporary carrier 52. More specifically, e.g., hundreds of composite chips 23 may be placed on the temporary carrier 52, the temporary carrier 52 may, e.g., be disc-shaped having a rounded outline and the lateral dimension, e.g., diameter, of the temporary carrier 52 may, e.g., be equal to or greater than 200 or 300 mm.

FIG. 4E illustrates applying an encapsulation material 50 to the composite chips 23 and the temporary carrier 52. By applying an encapsulation material 50 to the composite chips 23 and the temporary carrier 52 an artificial wafer 51 is generated. The artificial wafer 51 comprises an encapsulant in which the composite chips 23 are embedded, e.g., in a regular pattern. The artificial wafer 51 may, e.g., be disc-shaped having a rounded outline and a lateral dimension, e.g., diameter of the artificial wafer 51 may, e.g., be equal to or greater than 200 or 300 mm. The encapsulant embedding the composite chips 23 may be fabricated, e.g., by molding techniques or by lamination as mentioned above.

The encapsulation material 50 may, e.g., be the same material as the encapsulation material 80 mentioned above. Further, the material of the reinforcing wafer 16 may, e.g., be the same material as the encapsulation material 50. It is also possible to choose different materials for the encapsulation material 50 and the material of the reinforcing wafer 16. However, it may be advantageous to choose a material for the encapsulation material 50 which has a similar CTE (coefficient of thermal expansion) as the material of the reinforcing chips 26.

FIG. 4F illustrates releasing the artificial wafer 51 from the temporary carrier 52. The adhesive tape 40 may, e.g., exhibit thermo-release properties. In this and other cases, a thermo process may be used to remove the artificial wafer 51 from the adhesive tape 40 and, e.g., the adhesive tape 40 from the temporary carrier 52.

The artificial wafer 51 may comprise a plurality of composite chips 23 each comprising a semiconductor chip 24 and a reinforcing chip 26 wherein the plurality of composite chips 23 is embedded in the encapsulation material 50 forming the encapsulant. The semiconductor chips 24 of the composite chips 23 may be exposed at the lower side of the artificial wafer 51. More specifically, the lower surface of the encapsulant and the exposed face of the semiconductor chips 24 may, e.g., be flush and may, e.g., level with each other. The semiconductor chips, whether power chips, logic chips, or other chips, may have electrodes (not shown) arranged at the exposed chip face.

The artificial wafer 51 may then be subjected to further eWLP steps to form, e.g., an electrical redistribution structure (RDL) or an electrical interconnect (not shown) at the lower side of the artificial wafer 51. In particular, an eWLB (embedded Wafer Level Ball Grid Array) packaging process may be performed to produce BGA (Ball Grid Array) packages.

The artificial wafer 51 may then be singulated into a plurality of single semiconductor devices 300 by dividing the artificial wafer 51 along lines C. The semiconductor devices 300 may be fan-out type packages.

FIGS. 5A-5G illustrate an exemplary method of manufacturing a semiconductor device 400 in accordance with one embodiment. This method is similar to the method described in FIGS. 4A-4F. However, as a difference, the reinforcing chips 26 are removed before the encapsulation material 50 is applied to the semiconductor chips 24 and the temporary carrier 52.

Figure 5A:
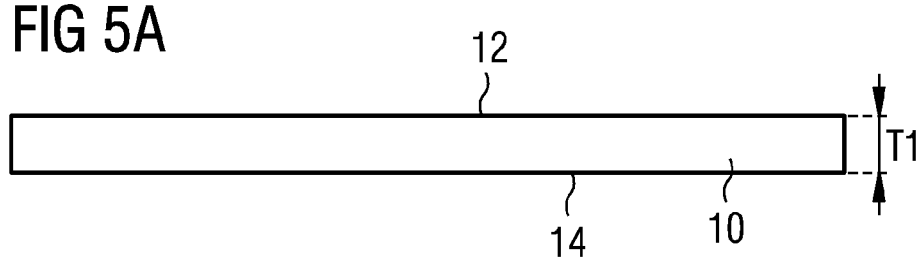
FIGS. 5A-5F schematically illustrate cross-sectional views of one embodiment of a method of manufacturing a semiconductor device.
Figure 5B:
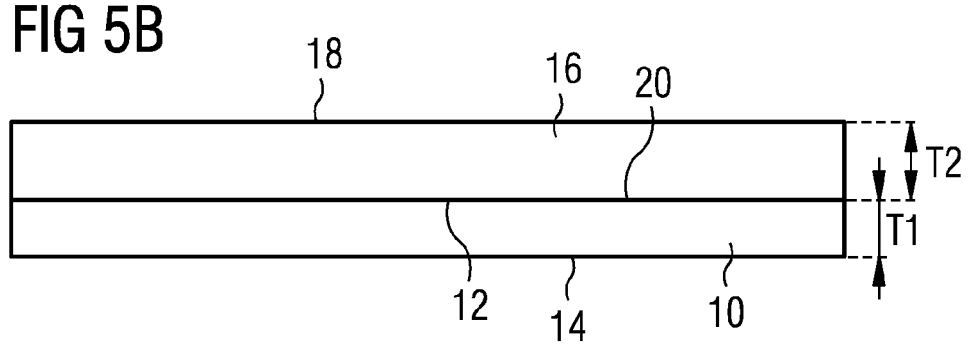
Figure 5C:
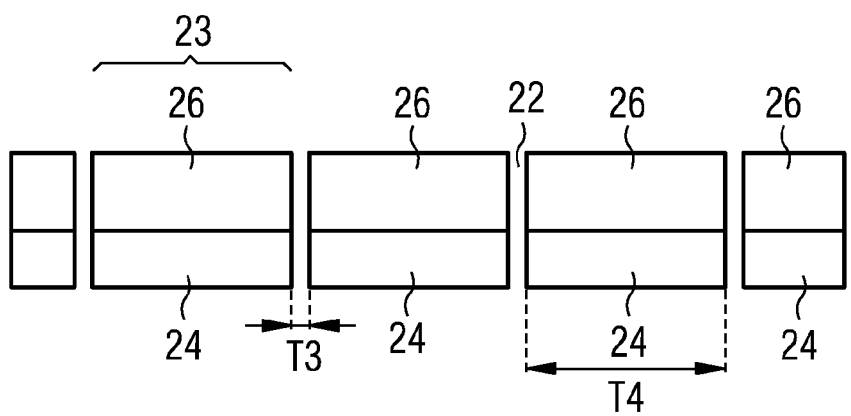

FIGS. 5A-5C illustrating the first steps of the method of manufacturing are identical to FIGS. 4A-4C, and reference is made to the above description in order to avoid reiteration. However, as the reinforcing chip 26 is not intended to be integrated into the semiconductor device 400, the CTE of the material of the reinforcing wafer 16 may be different from the CTE of the encapsulation material 50 and, e.g., different materials may be used.

Then, the composite chips 23 are releasably fixed to a temporary carrier 52. Reference is made to the description in conjunction with FIG. 4D to avoid reiteration.

Figure 5D:
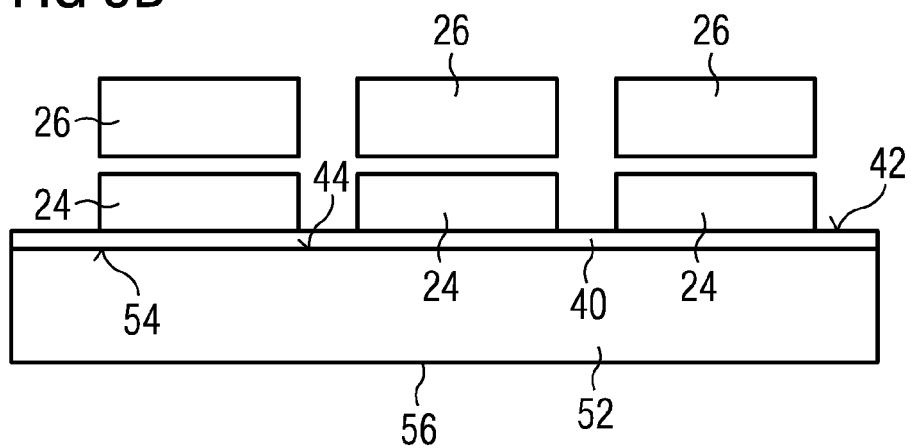

FIG. 5D illustrates removing the reinforcing chips 26 from the semiconductor chips 24. The process of removing the reinforcing chips 26 may be assisted by applying energy, e.g., heat to the composite chips 23. The semiconductor chips 24 are not released from the temporary carrier 52 during the process of removing the reinforcing chips 26 from the semiconductor chips 24.

Figure 5E:
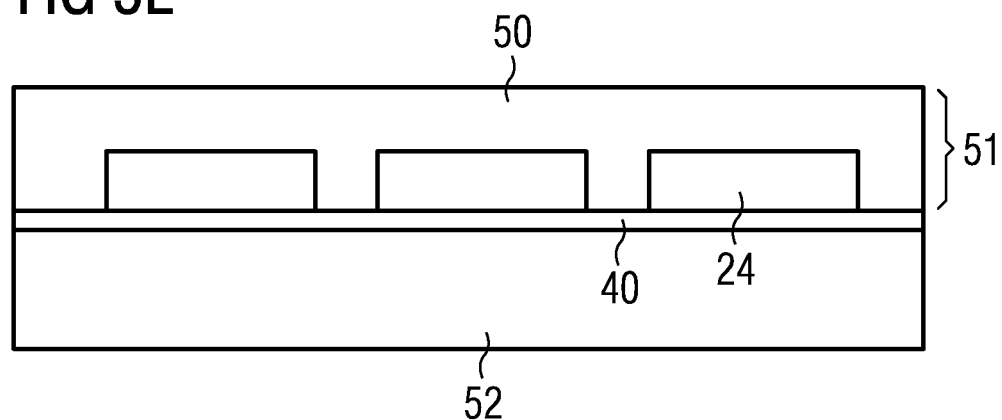
Figure 5F:
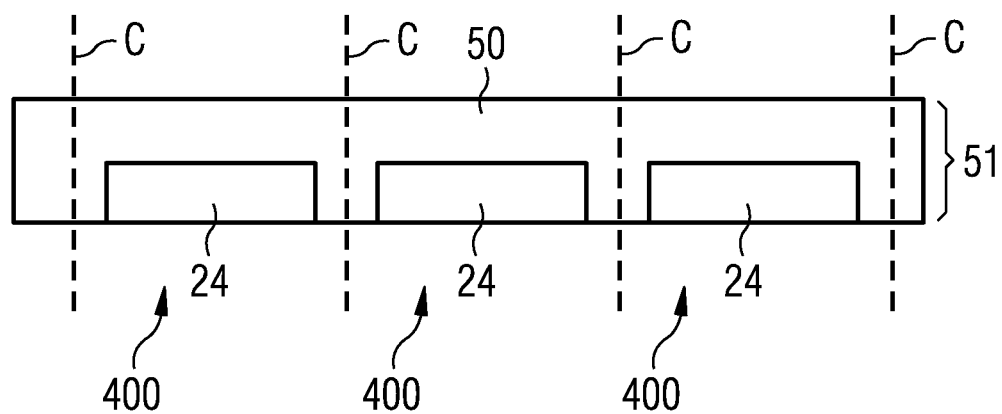

FIGS. 5E and 5F illustrate generating the artificial wafer 51 on the temporary carrier 52 and releasing the artificial wafer 51 from the temporary carrier 52, respectively. The method steps of FIGS. 5E and 5F may have the same properties as the method steps shown in FIGS. 4E and 4F, respectively.

The artificial wafer 51 may then be subjected to further eWLP steps as described with reference to FIG. 4F, to which reference is made. That way, e.g., an electrical redistribution structure, an electrical interconnect (not shown) and/or solder bumps may be formed at the lower side of the artificial wafer 51.

FIGS. 6A-6D illustrate a method of embedding a semiconductor chip 24 within deposited metal on a substrate by galvanically depositing a metal layer onto the substrate.

Figure 6A:
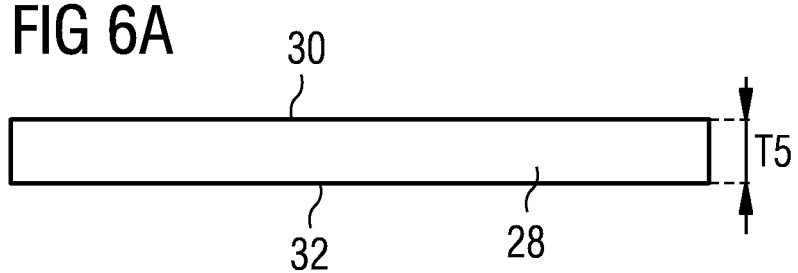
FIGS. 6A-6D schematically illustrate cross-sectional views of one embodiment of a method of embedding a semiconductor chip.

FIG. 6A illustrates providing a substrate 28 which may have a first main face 30 and a second main face 32. The substrate 28 of FIG. 6A may have the same features as the substrate 28 described before. To avoid reiteration, reference is made to the above description.

Figure 6B:
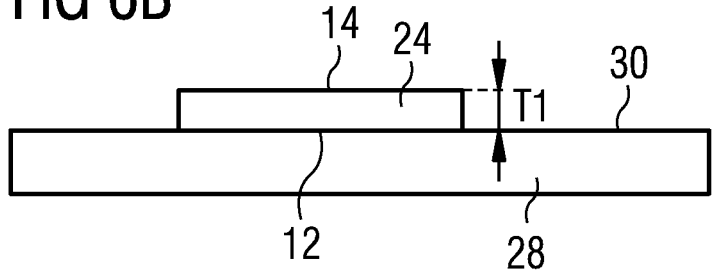

FIG. 6B illustrates a semiconductor chip 24 which is attached to the first main face 30 of the substrate 28. The semiconductor chip 24 may comprise a first main face 12 and the second main face 14 and may, e.g., have a thickness T1 as described above. When being placed on the substrate 28, the semiconductor chip 24 may, e.g., comprise a reinforcing chip 26 on its main face 14 facing away from the substrate 28. That is, a composite chip 23 as described above may be placed on the substrate 28 and the reinforcing chip 26 may be released from the semiconductor chip 24 after the semiconductor chip 24 has been attached, e.g., bonded to substrate 28. Again, reference is made to the above description to avoid reiteration.

It may also be possible that other techniques than using a reinforcing chip 26 may be utilized to manipulate the semiconductor chip 24 and to place it on the substrate 28. In particular, it may be possible that the semiconductor chip 24 is placed on and bonded to the substrate 28 without using a reinforcing chip 26 and thus without the step of releasing such reinforcing chip 26 from the semiconductor chip 24.

Figure 6C:
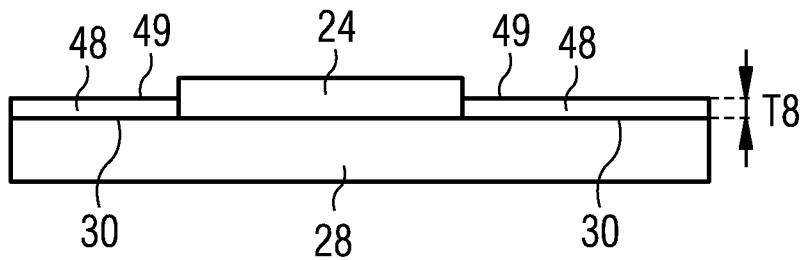

FIG. 6C illustrates embedding the semiconductor chip 24 by depositing a metal layer 48 onto the first main face 30 of the substrate 28. By applying a metal deposition process to the first main face 30 of the substrate 28, a metal layer 48 may grow onto the first main face 30 of the substrate 28. The thickness of the deposited metal layer 48 may be T8. As the process is such that no metal grows on the semiconductor chip 24, the distance between the second main face 14 of the semiconductor chip 24 and the outer surface of the deposited metal layer 48 will decrease.

Figure 6D:
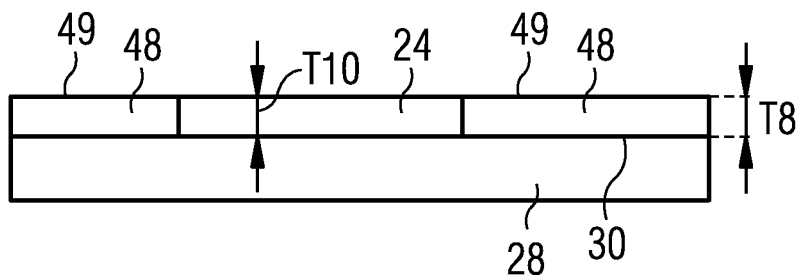

The metal layer 48 may, e.g., be galvanically deposited onto the first main face 30 of the substrate 28. As illustrated in FIG. 6D, this process of growing the metal layer 48 by, e.g., galvanically depositing metal onto the substrate 28 may, e.g., be continued until a main surface of the semiconductor chips 24 facing away from the substrate 28 and the outer surface 49 of the deposited metal 48 are at the same level with each other, e.g., within a tolerance TOL of less than 5 μm, 2 μm, 1 μm, or 0.5 μm (wherein TOL=|T10−T8|, with T10 being the distance between the first main face 30 of the substrate 28 and the outer surface 49 of the deposited metal layer 48). Further, the main face 14 of the semiconductor chip 24 facing away from the substrate 28 and the outer surface of the deposited metal 48 may, e.g., be flush, i.e., without gap in between. Thus, the semiconductor chip 24 may, e.g., be completely embedded into the metal at its lateral sides.

If one considers the substrate 28 plus the galvanically deposited metal layer 48 to be a new substrate, then one can say that the process step of FIG. 6D may reduce the topographic differences between the main face of the semiconductor chip 24 facing away from the new substrate and the outer surface of the new substrate to form a common plane or platform for further processing. Further processing of the structure shown in FIG. 6D may include thin film processing, e.g., thin film metal layer generation or thin film polymer layer generation, structuring, vias generation, lamination, molding, or other process steps used in the technology of packaging. Reference is made to the description of FIGS. 3H-3J to avoid reiteration.

It should be appreciated herein that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), PVD (physical vapor deposition), evaporation, hybrid physical-chemical vapor deposition (HPCVD), etc.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method comprising:
    gluing with a releasable glue a reinforcing wafer to a first main surface of a semiconductor wafer thereby forming a composite wafer;
    dividing the composite wafer thereby generating a plurality of composite chips, each composite chip comprising a semiconductor chip and a reinforcing chip;
    bonding at least one of the plurality of composite chips to a substrate; and
    separating the reinforcing chip from the semiconductor chip during or after bonding the at least one of the plurality of composite chips.

2. The method of claim 1, wherein the semiconductor wafer has a thickness less than 40 μm.

3. The method of claim 1, wherein the first main surface of the semiconductor wafer is a front side of the semiconductor wafer.

4. The method of claim 1, wherein the first main surface of the semiconductor wafer is a back side of the semiconductor wafer.

5. The method of claim 1, further comprising thinning the semiconductor wafer before applying the reinforcing wafer to the semiconductor wafer.

6. The method of claim 1, further comprising thinning the semiconductor wafer after applying the reinforcing wafer to the semiconductor wafer.

7. The method of claim 1, further comprising attaching the plurality of composite chips to a temporary carrier.

8. The method of claim 7, further comprising applying an encapsulation material to the plurality of composite chips and the temporary carrier thereby generating an artificial wafer.

9. The method of claim 8, further comprising releasing the artificial wafer from the temporary carrier.

10. The method of claim 1, wherein the at least one of the plurality of composite chips is bonded to the substrate with the semiconductor chip facing the substrate.

11. The method of claim 1, further comprising:
    releasably attaching the plurality of composite chips to an attach panel; and
    bonding the plurality of composite chips to the substrate in a batch process.

12. The method of claim 1, wherein bonding the at least one of the plurality of composite chips to the substrate and separating the reinforcing chip from the semiconductor chip is performed within a single thermal process.

13. The method of claim 1, further comprising depositing a metal onto the substrate to embed the semiconductor chip in the deposited metal.

14. The method of claim 13, wherein a main surface of the at least one of the semiconductor chips facing away from the substrate and an outer surface of the deposited metal are at the same level with each other within a tolerance of less than 2 μm.

15. A method comprising:
    applying a reinforcing wafer to a semiconductor wafer thereby forming a composite wafer;
    dividing the composite wafer thereby generating a plurality of composite chips, each composite chip comprising a semiconductor chip and a reinforcing chip;
    bonding at least one of the plurality of composite chips to a substrate; and separating the reinforcing chip from the semiconductor chip during or after bonding the at least one of the plurality of composite chip.

16. The method of claim 15, wherein bonding the at least one of the plurality of composite chips to the substrate and separating the reinforcing chip from the semiconductor chip is performed within a single thermal process.

17. The method of claim 15, wherein the semiconductor wafer has a thickness less than 40 μm.

18. The method of claim 17, wherein the reinforcing wafer comprises a material selected from the group consisting of glass, a resin material, copper, a copper alloy, a mold material and amorphous silicon.

19. A method comprising:
 gluing with a releasable glue a reinforcing wafer to a semiconductor wafer thereby forming a composite wafer;
 dividing the composite wafer thereby generating a plurality of composite chips, each composite chip comprising a semiconductor chip and a reinforcing chip;
 bonding at least one of the plurality of composite chips to a substrate; and
 separating the reinforcing chip from the semiconductor chip during or after bonding the at least one of the plurality of composite chips.

20. The method of claim 19, wherein bonding the at least one of the plurality of composite chips to the substrate and separating the reinforcing chip from the semiconductor chip is performed within a single thermal process.

21. The method of claim 1, wherein the reinforcing wafer comprises a material selected from the group consisting of a resin material, copper, a copper alloy, a mold material and amorphous silicon.

* * * * *